United States Patent [19]
Ueda et al.

[11] Patent Number: 5,344,744
[45] Date of Patent: Sep. 6, 1994

[54] PHOTOSENSITIVE RESIN COMPOSITION

[75] Inventors: Koichi Ueda, Neyagawa; Kazunori Kanda, Yao; Hidefumi Kusuda, Takatsuki, all of Japan

[73] Assignee: Nippon Paint Co., Ltd., Osaka, Japan

[21] Appl. No.: 848,360

[22] Filed: Mar. 9, 1992

[30] Foreign Application Priority Data

Apr. 24, 1991 [JP] Japan ................... 3-094125

[51] Int. Cl.$^5$ ................................ G03C 1/73
[52] U.S. Cl. ................... 430/287; 430/281; 430/283; 430/284; 430/907; 430/910
[58] Field of Search ............. 430/286, 287, 281, 907, 430/910, 283, 284, 18

[56] References Cited

U.S. PATENT DOCUMENTS

| | | | |
|---|---|---|---|
| 4,996,134 | 2/1991 | Enyo et al. | 430/286 |
| 5,073,477 | 12/1991 | Kusuda et al. | 430/287 |
| 5,175,076 | 12/1992 | Ishikawa et al. | 430/286 |
| 5,230,987 | 7/1993 | Kawanami et al. | 430/284 |

FOREIGN PATENT DOCUMENTS 0277418 8/1988 European Pat. Off. .

*Primary Examiner*—Christopher Rodee
*Attorney, Agent, or Firm*—Wenderoth, Lind & Ponack

[57] ABSTRACT

The present invention imparts elasticity, reproducibility of dots, film toughness and wear resistance to printing plates obtained therefrom, in addition to good water developability and mechanical properties, by providing a photosensitive resin composition comprising:
- (A) 10 to 90% by weight of specific crosslinked polymer particles having a particle size of 0.01 to 5 micron,
- (B) 10 to 70% by weight of a specific hydrophobic elastomer,
- (C) 1 to 25% by weight of a hydophilic polymer having a molecular weight of 1,000 to 1,000,000,
- (D) 1 to 30% by weight of a basic nitrogen-containing compound,
- (E) 1 to 60% by weight of a photopolymerizable ethylenically unsaturated monomer, and
- (F) 0.01 to 10% by weight of a photopolymerization initiator; % by weight being based on a total amount of the resin composition. The present invention also provides a flexoprinting plate obtained from the above resin composition and a process for producing the flexoprinting plate.

7 Claims, No Drawings

PHOTOSENSITIVE RESIN COMPOSITION

FIELD OF THE INVENTION

The present invention relates to a photosensitive resin composition which has excellent photosensitivity, excellent physical properties after curing and excellent workability. More particularly, it relates to a photosensitive resin composition for flexographic printing which is water developable and when cured has rubber resilience.

DEFINITION OF TECHNICAL TERMS

By "resin plate" herein is meant a plate on which a photosensitive resin layer before exposing to light and developing is present.

By "printing plate" herein is meant a plate on which a resin layer which has been exposed to light and developed, i.e. a relief layer, is present.

BACKGROUND OF THE INVENTION

It is desired that a photosensitive resin plate for flexographic printing can be developed with water rather than organic solvent, because of easy treatment, worker's health, safety and environmental pollution. A printing plate having a relief layer obtained from the photosensitive resin plate is contacted with ink, particularly aqueous ink or alcoholic ink. The relief layer accordingly has to have suitable chemical resistance against the solvent of the ink. It is also required that the printing plate keeps its physical or chemical properties during the printing operation.

Japanese Kokoku Publication 53-35481 discloses a liquid type photosensitive resin composition which contains a liquid unsaturated polyester as a main component. The composition is liquid and therefore it is difficult to obtain precise film thickness on a substrate. The composition necessitates the use of an air knife for developing.

U.S. Pat. No. 4,369,246 discloses a solid type photosensitive resin composition which, however, is developable with organic solvent and therefore does not meet the trend toward water developing.

Water developable photosensitive resin compositions for flexographic printing are proposed in U.S. Pat. Nos. 2,893,868, 4,275,142 and Japanese Kokai Publication 61-22339. However, the compositions disclosed in the two U.S. Patents have poor water resistance of the resulting printing plate and also do not have sufficient water developability. The composition of the Japanese Publication has poor mechanical properties after developing.

U.S. Pat. No. 4,177,074 and Japanese Kokoku Publication 60-45416 suggest a combination of a high molecular weight polymer prepared from a high molecular weight conjugated diolefin hydrocarbon and a low molecular weight polymer prepared from a low molecular weight conjugated diolefin hydrocarbon, which improves developability. This composition, however, does not improve mechanical properties.

The present inventors have proposed in Japanese Kokai Publication 1-300246 (corresponding U.S. Pat. No. 5,073,477) a photosensitive resin composition for flexographic printing which comprises (i) crosslinked polymer particles and (ii) a linear polymer with at least 5,000 molecular weight, which contains at least 30 mol % of conjugated diene units in one molecule. The composition has good water developability and when developed has good mechanical properties.

SUMMARY OF THE INVENTION

The present inventors have improved the above proposed technique to impart elasticity, reproducibility of dots, film toughness and wear resistance to the printing plates obtained therefrom, in addition to the good water developability and mechanical properties. The present invention thus provides a photosensitive resin composition comprising:

(A) 10 to 90% by weight of crosslinked polymer particles having a particle size of 0.01 to 5 micron, prepared from an aliphatic conjugated diene monomer, a monofunctional monomer and a polyfunctional monomer, (B) 10 to 70% by weight of a hydrophobic elastomer having a molecular weight of 5,000 to 1,000,000 and at least one glass transition temperature of 5° C. or less, prepared from at least 30 mol % of a conjugated diene monomer and the balance of other monomers, (C) 1 to 25% by weight of a hydophilic polymer having a molecular weight of 1,000 to 1,000,000, (D) 1 to 30% by weight of a basic nitrogen-containing compound, (E) 1 to 60% by weight of a photopolymerizable ethylenically unsaturated monomer, and (F) 0.01 to 10% by weight of a photopolymerization initiator; % by weight being based on a total amount of the resin composition.

The present invention also provides a flexoprinting plate obtained from the above resin composition and a process for producing the flexoprinting plate.

DETAILED DESCRIPTION OF THE INVENTION

The crosslinked polymer particles (A) employed in the present invention may be prepared from an aliphatic conjugated diene monomer, a monofunctional ethylenically unsaturated monomer and a polyfunctional ethylenically unsaturated monomer. For example, the polymer particles may be prepared from (1) 20 to 95% by weight, preferably 25 to 85% by weight, of an aliphatic conjugated diene monomer, (2) 0.1 to 30% by weight, preferably 0.5 to 25% by weight, of alpha, beta-ethylenically unsaturated carboxyl group-containing monomer, (3) 0.1 to 10% by weight, preferably 0.5 to 8% by weight, of a monomer having at least two addition-polymerizable groups in one molecule, and (4) 0.5 to 70% by weight, preferably 1 to 60% by weight, of other copolymerizable monomers.

Typical examples of the aliphatic conjugated diene monomers (1) are butadiene, isoprene, dimethylbutadiene, chloroprene and the like. Examples of the alpha, beta-ethylenically unsaturated carboxyl group-containing monomers (2) are acrylic acid, methacrylic acid, maleic acid, monoethyl maleate, itaconic acid, fumaric acid, tetraconic acid, crotonic acid and the like. Examples of the monomers having at least two addition-polymerizable groups in one molecule (3) are trimethylolpropane di(meth)acrylate, trimethylolpropane tri(meth)acrylate, divinyl benzene, ethyleneglycol di(meth)acrylate, pentaerythritol tri(meth)acrylate, pentaerythritol tetra(meth)acrylate, 1,4-butandiol di(meth)acrylate, 1,6-hexanediol di(meth)acrylate, triethyleneglycol di(meth)acrylate, tetraethyleneglycol di(meth)acrylate, 1,3-butyleneglycol di(meth)acrylate, neopentylglycol di(meth)acrylate, pentaerythritol di(meth)acrylate, glycerol di(meth)acrylate, glycerolallyloxy di(meth)acrylate, 1,1,1-trishydroxymethylethane di(meth)acrylate, 1,1,1-trishydroxymethylethane tri(meth)acrylate, 1,1,1-trishydroxymethylpropane di(meth)acrylate, 1,1,1-trishydroxymethylpropane tri(meth)acrylate, triallyl cyanulate, triallyl isocyanulate, triallyl trimellitate, diallyl terephthalate, diallyl phthalate and the like. If necessary, ethylenically unsaturated monomers having functional groups which are reactive with each other may be employed. For example, an ethylenically unsaturated monomer having an epoxy group (e.g. glycidyl (meth)acrylate) can be combined with an ethylenically unsaturated monomer having a carboxyl group (e.g. (meth)acrylic acid and crotonic acid). Examples of the combination of the functional groups which are reactive with each other are amine and carbonyl, epoxide and carboxylic anhydride, amine and carboxylic halide, alkyleneimine and carbonyl, organoalkoxysilane and carboxyl, hydroxyl and isocyanate, and the like. Examples of the other copolymerizable monomers (4) are a hydroxyl group-containing monomer, such as 2-hydroxyethyl (meth)acrylate, hydroxypropyl (meth)acrylate, hydroxybutyl (meth)acrylate, allyl alcohol, methallyl alcohol, N-(hydroxyphenyl) (meth)acrylamide, o-, m- or p-hydroxystyrene and o-, m- or p-hydroxyphenyl (meth)acrylate; an alkyl (meth)acrylate, such as methyl (meth)acrylate, ethyl (meth)acrylate, n-butyl (meth)acrylate, propyl (meth)acrylate, acyl (meth)acrylate, cyclohexyl (meth)acrylate, octyl (meth)acrylate and 2-chloroethyl (meth)acrylate; a polymerizable amide, such as (meth)acrylamide, N-methylol (meth)acrylamide, N-ethyl (meth)acrylamide, N-hexyl (meth)acrylamide, N-cyclohexyl (meth)acrylamide, N-hydroxyethyl (meth)acrylamide, N-phenyl (meth)acrylamide, N-nitrophenyl (meth)acrylamide and N-ethyl-N-phenyl (meth)acrylamide; a nitrogen-containing alkyl (meth)acrylate, such as dimethylaminoethyl (meth)acrylate; a vinyl ether, such as ethyl vinyl ether, 2-chloroethyl vinyl ether, hydroxyethyl vinyl ether, propyl vinyl ether, butyl vinyl ether, octyl vinyl ether and phenyl vinyl ether; a vinyl ester, such as vinyl acetate, vinyl chloroacetate, vinyl butylate and vinyl benzoate; a styrene derivative, such as styrene, alpha-methylstyrene and chloromethylstyrene; a vinyl ketone, such as methyl vinyl ketone, ethyl vinyl ketone, propyl vinyl ketone and phenyl vinyl ketone; an olefin, such as ethylene, propylene and isobutylene; glycidyl methacrylate; a polymerizable nitrile, such as (meth)acrylonitrile, N-vinylpyrrolidone, N-vinylcarbasole and 4-vinylpyridine; a sulonic acid group containing monomer, such as, vinylsulfonic acid, styrene-p-sulfonic acid, 2-acrylamide-2-methylpropanesulfonic acid, 2-sulfoxyethyl methacrylate; an amphoteric monomer, such as N,N-dimethyl-N-methacryloxyethyl-N-(3-sulfopropyl)ammonium betaine, N,N-dimethyl-N-methacrylamidepropyl-N-(3-sulfopropyl)ammonium betaine, 1-(3-sulfopropyl)-2-vinylpyridinium betaine; a derivative thereof, such as a monomer prepared by reacting the above mentioned hydroxyl group containing-monomer with an isocyanate compound, a monomer prepared by reacting the above mentioned carboxyl group containing-monomer with a glycidyl group containing monomer; and a mixture thereof.

If the amount of aliphatic conjugated diene monomer is less than 20% by weight, rubber resilience of the obtained printing plate is poor. If it is more than 95% by weight, water developability of the resin plate is poor.

If the amount of alpha, beta-ethylenenically unsaturated carboxyl group-containing monomer is less than 0.1% by weight, water developability of the resin plate is poor. If it is more than 30% by weight, water resistance of the resulting printing plate is poor. If the amount of compound (3) is less than 0.1% by weight, film forming ability of the resin composition is poor. If it is more than 10% by weight, rubber resilience of the resulting printing plate is poor. The compound (3) imparts solid retention, water resistance, water developability and molding properties to obtained crosslinked polymer particles.

The crosslinked polymer particles are prepared by methods well known to the art. For example, the monomer mixture of the above four components (1), (2), (3) and (4) is emulsion-polymerized in the presence of surfactant in a pressurized vessel. In detail, the monomer mixture is polymerized in an aqueous medium in the presence of sodium persulfate (polymerization initiator) and sodium dodecylbenzenesulfonate (emulsifier) at a temperature of about 15° to 20° C. The emulsion polymerization process is know to the art, for example as disclosed in U.S. Pat. Nos. 4,927,738, 4,985,513 and 4,996,134.

The crosslinked polymer particles may be prepared by another process, for example, forming a reactive surfactant from the aliphatic diene monomer (1) and optionally the monomer (2) and/or (4) which may be modified, and then polymerizing the monomers (2), (3) and (4) in the presence of the above obtained reactive surfactant (see Japanese Kokai Publication 2-167344, Japanese Patent Application Ser. Numbers 1-178459 2-6576 and 2-22946). The reactive surfactant preferably has (i) dispersibility in an aqueous medium and radical reactivity, and (ii) Tg of 0° C. or less. However, a preferred one is a maleic modified elastic polymer having an acid value of 5 to 120. The maleic modified elastic polymer may be prepared by modifying a polymer (e.g. polybutadiene, polyisoprene, chloroprene, styrene-butadiene copolymer, acrylonitrile-butadiene copolymer, acrylic rubber, butyl rubber, poly-caproractone, polytetramethylene glycol etc.) with maleic acid, and then half-esterifying it with 2-hydroxyethyl (meth)acrylate or alcohols. The reactive surfactant can be also prepared by polymerizing or oligomerizing the aliphatic diene monomer (1) with the other monomers (2), (3) or (4), which is then modified to introduce ethylenically unsaturated groups. The modification preferably conducted by reacting the terminal hydroxyl group of the polymer or oligomer with an isocyanate compound having an ethylenically unsaturated group, for example a reaction product of a diisocyanate and a hydroxyl group-containing alpha, beta-ethylenically unsaturated monomer.

The polymer particles may be prepared by polymerizing the monomers (2) to (4) in the presence of the reactive surfactant mentioned above. The reactive surfactant is generally mixed intact or with an aqueous medium which may contain alcohols or other organic solvents to form an emulsion in which the monomers (2) to (4) are dispersed by a homogenizer, then polymerized. The polymerization is conducted at a temperature of 40° to 100° C. for one to 10 hours. The polymerization is generally initiated with a radical polymerization initiator, such as azoisobutylonitrile, 4,4'-azobis-4-cyanovaleric acid, ammonium persulfate, potassium persulfate and the like. The amount of the reactive surfactant is not limited as long as the obtained crosslinked polymer particles meet the above mentioned requirements. If it is present in a small amount, film forming ability is poor and if it is present in a large amount, water developability is poor.

The crosslinked polymer particles (A) thus obtained are isolated, dried and rinsed. The process is well known. For example, the reacted mixture may be spray-dried or freeze-dried. The reacted mixture may also be salted out by adding an inorganic salt, such as calcium chloride, sodium chloride and magnesium chloride, and then filtered, rinsed with water and dried (vacuum dried) to obtain dried polymer particles.

The hydrophobic elastomer (B) employed in the present invention contains conjugated diene monomer units in an amount of at least 30 mol %, preferably at least 40 mol % in one molecule, and has a molecular weight of 5,000 to 1,000,000, preferably 10,000 to 500,000. The elastomer (B) also has at least one glass transition temperature of 5° C. or less, preferably −5° C. or less, more preferably −30° C. or less. If the amount of conjugated diene monomer is less than 30 mol %, resilience, flexibility and image quality are poor. If the molecular weight is outside the above range, the obtained resin composition has poor water developability and the obtained image quality is poor. The elastomer (B) can be a polymer of conjugated diene monomers or a copolymer of conjugated diene monomers and other copolymerizable monoolefinic monomers. The process for producing the elastomer (B) is known to the art. Examples of the conjugated diene monomers are butadiene, isoprene, chloroprene, a mixture thereof and the like. Typical examples of the other copolymerizable monoolefinic monomers are styrene, alpha-methylstyrene, o-methylstyrene, m-methylstyrene, p-methylstyrene, acrylonitrile, methacrylonitrile, vinyl chloride, vinylidene chloride, acrylic acid, methacrylic acid, vinyl acetate, an acrylate, a methacrylate and the like. If the above conjugated diene monomers and the other copolymerizable monoolefinic monomers are employed, the obtained elastomer preferably is a block copolymer.

Typical examples of the elastomers (B) are polybutadiene, polyisoprene, polychloroprene, styrene-butadiene copolymer, styrene-isoprene copolymer, styrene-chloroprene copolymer, acrylonitrile-butadiene copolymer, acrylonitrile-isoprene copolymer, acrylonitrile-chloroprene copolymer, methyl (meth)acrylate-butadiene copolymer, methyl (meth)acrylate-isoprene copolymer, methyl (meth)acrylate-chloroprene copolymer, acrylonitrile-butadiene-styrene copolymer, acrylonitrile-isoprene-styrene copolymer, acrylonitrile-chloroprene-styrene copolymer, a block copolymer (such as polystyrene-polyisoprene, polystyrene-polybutadiene, polyisoprene-polybutadiene, polystyrene-polybutadiene-polystyrene, polystyrene-polyisoprene-polystyrene, polystyrene-polyethylene-polystyrene, polystyrene-polyethylene/butylene-polystyrene), a mixture thereof and the like.

The hydrophilic polymer (C) employed in the present invention has a molecular weight of 1,000 to 1,000,000, preferably 5,000 to 500,000. The polymer (C) may be prepared by introducing hydrophilic groups into a suitable backbone polymer. Examples of the backbone polymers are a polymer obtained from conjugated dienes, a copolymer of the conjugated dienes and monoolefinic unsaturated compound and/or other vinyl polymers. Examples of the hydrophilic groups are carboxyl groups, sulfonic acid groups, amino groups and the like. The hydrophilic properties of the polymer (C) are generally expressed as acid value or amine value which is preferably within the range of 2 to 200, more preferably 20 to 80. If it is less than 2, water developability is poor and if it is more than 200, physical properties and image quality are poor.

Typical examples of the backbone polymers are polybutadiene, polyisoprene, polychloroprene, styrene-butadiene copolymer, styrene-isoprene copolymer, styrene-chloroprene copolymer, acrylonitrile-butadiene copolymer, acrylonitrile-isoprene copolymer, acrylonitrile-chloroprene copolymer, methyl (meth)acrylate-isoprene copolymer, methyl (meth)acrylate-butadiene copolymer, methyl (meth)acrylate-chloroprene copolymer, acrylonitrile-butadiene-styrene copolymer, acrylonitrile-isoprene-styrene copolymer, acrylonitrile-chloroprene-styrene copolymer, a block copolymer (e.g. polystyrene-polyisoprene, polystyrene-polybutadiene, polyisoprene-polybutadiene, polystyrene-polybutadiene-polystyrene, polystyrene-polyisoprene-polystyrene, polystyrene-polyethylene/butylene-polybutadiene), epichlorohydrin rubber (epichlorohydrin polymer, epichlorohydrin-ethylene oxide copolymer, epichlorohydrin-propylene oxide copolymer, a copolymer thereof with allyl glycidyl ether), halogenated polyethylene, polyvinyl chloride, polyvinylidene chloride, polypropylene chloride, ethylene chloride-propylene rubber, and the like. The introduction of the hydrophilic groups may be conducted by using monomers having the hydrophilic groups, such as carboxyl groups or amino groups in preparation of the above polymer or copolymer.

The introduction of the hydrophilic groups may generally be conducted by modifying the above mentioned backbone polymer with maleic acid which is then half-esterified with an alcohol or a hydroxyl group-containing monomer. The hydroxyl-group-containing monomer can impart photopolymerizing ability to the hydrophilic polymer (C) so as to enhance mechanical properties of the cured composition. Typical examples of the alcohols are methanol, ethanol, butanol, propanol, lauryl alcohol and the like. Typical examples of the hydroxyl group-containing monomers are 2-hydroxyethyl (meth)acrylate, hydroxypropyl (meth)acrylate, hydroxybutyl (meth)acrylate, allyl alcohol, methallyl alcohol, N-(4-hydroxyphenyl) (meth)acrylamide, o-, m- or p-hydroxyphenyl (meth)acrylate, and the like. Preferred are 2-hydroxyethyl (meth)acrylate and hydroxypropyl (meth)acrylate.

The hydrophilic polymer (C) may also be a diene polymer which is modified with an amine. For example, polybutadiene is treated with peracetate to form an oxirane group at a vinyl group, which is then reacted with an amine to introduce an amino group. The amino group is neutralized with an acid to form a cationic polybutadiene. This modification is generally employed in the field of the resin synthesis for electrodeposition coating.

The hydrophilic polymer (C) may further be the other vinyl polymers into which carboxyl, sulfon or amino groups are introduced. It may furthermore be carboxyl group-containing polyurethane, carboxyl group-containing polyurea-urethane, carboxyl group-containing polyester, carboxyl group-containing polyamide, sodium polyacrylate and the like.

The hydrophilic polymer (C) may be used in combination with another polymer, such as polyacrylamide, polyvinyl alcohol, carboxymethyl cellulose, hydroxyethyl cellulose, methyl cellulose, polyethylene oxide, polypropylene oxide, polytetramethylene glycol, polyethyleneimine and the like.

It is preferred that the hydrophilic polymer (C) is one prepared by reacting the backbone polymer containing conjugated diene unit with maleic acid, and then half-esterifying with alcohols and/or hydroxyl group-containing monomers. The backbone polymer preferably includes polybutadiene, polyisoprene, styrene-butadiene copolymer, styrene-isoprene copolymer, polystyrene-polybutadiene block copolymer, polystyrene-polyisoprene block copolymer and polystyrene-polyisoprene-polystyrene block copolymer.

The basic nitrogen-containing compound (D) preferably contains a tertiary basic nitrogen atom and a vinyl group. The compound is represented by the following formula (I) or (II);

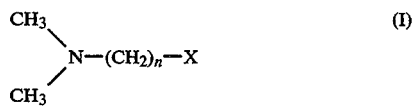

wherein n is an integer of 1 to 3, X represents —O—CO—CR=CH$_2$, —NH—CO—CR=CH$_2$ or —O—CO—NH—CO—CR=CH$_2$ in which R independently represents a hydrogen atom or a methyl group

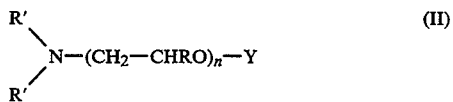

wherein n is an integer of 1 to 6 when R' is a methyl group and an integer of 2 to 6 when R' is an ethyl group, Y represents a hydrogen atom, —CO—CR=CH$_2$ or —CO—NH—CO—CR=CH$_2$ in which R independently represents a hydrogen atom or a methyl group.

It is preferred when Y is not a hydrogen atom. Preferred are N,N-dimethylaminoethyl (meth)acrylate, N,N-dimethylaminopropyl (meth)acrylamide, N,N-dimethylaminoethyl-N'-(meth)acryloyl carbamate, N,N-diethylaminoethoxyethyl (meth)acrylate, N,N-diemethylaminoethoxyethanol, N,N-diethylaminoethoxyehtanol and the like. The amine compounds which do not contain a polymerizable group, such as 2-N-morpholinoethanol and 2-piperidinoethanol, can also be used in combination with the above compound (I) or (II). Monoamines, diamines and triamines having a boiling point of 50° C. or more can also be used.

The photopolymerizable ethylenically unsaturated monomer (E) imparts high water resistance to the resulting printing plate. The monomer (E) is a compound having one or more ethylenically unsaturated groups, preferably a compound having two or more ethylenically unsaturated groups (polyfunctional monomer). The polyfunctional monomer provides high water resistance to the resulting printing plate, but does not inhibit developability of the resin plate to water. The monomer (E) may include the above mentioned monomers (2) to (4) which are employed for preparation of the component (A) and the monomers having good solubility with resins as disclosed in U.S. Pat. No. 3,801,328. Typical examples of the monomers (E) are unsaturated carboxylic esters, such as n-butyl (meth)acrylate, 2-ethylhexyl (meth)acrylate, lauryl (meth)acrylate, stearyl (meth)acrylate, polyethyleneglycol mono(meth)acrylate, methoxypolyethyleneglycol mono(meth)acrylate, polypropyleneglycol mono(meth)acrylate, phenoxypolyethyleneglycol mono(meth)acrylate, ethyleneglycol di(meth)acrylate, diethyleneglycol di(meth)acrylate, triethyleneglycol di(meth)acrylate, diallyl itaconate, glycerol di(meth)acrylate, glycerol tri(meth)acrylate, 1,3-propyleneglycol di(meth)acrylate, 1,4-cyclohexanediol di(meth)acrylate, 1,2,4-butanetriol tri(meth)acrylate, glycerolpolypropyleneglycol tri(meth)acrylate, 1,4-benzenediol di(meth)acrylate, pentaerythritol tetra(meth)acrylate, tetramethyleneglycol di(meth)acrylate, 1,5-pentanediol di(meth)acrylate, 1,6-hexanediol di(meth)acrylate etc.; unsaturated amides, such as methylenebis (meth)acrylamide, ethylenebis (meth)acrylamide, 1,6-hexamethylenebis (meth)acrylamide, dithylenektriaminetris (meth)acrylamide, N-(hydroxymethyl) (meth)acrylamide, N-(beta-hydroxyethyl) (meth)acrylamide, N,N'-bis(beta-hydroxyethyl) (meth)acrylamide etc.; divinyl esters, such as divinyl adipate, divinyl phthalate etc.; (meth)acrylated urethanes prepared by reacting hydroxyalkyl (meth)acrylate and an isocyanate compound; di(meth)acrylic esters; a mixture thereof; and the like. Preferred are monomers which are insoluble in water.

The photopolymerization initiator (F) includes benzoin ethers, such as benzoin isopropyl ether and benzoin isobutyl ether; benzophenones, such as benzophenone, methyl-o-benzoin benzoate and 4,4'-bis(dimetylamino)-benzophenone; xanthones, such as xanthone, thioxanthone and 2-chlorothioxanthone; acetophenones, such as acetophenone, trichloroacetophenone, 2,2-diethoxyacetophenone and 2,2-dimethoxy-2-phenylacetophenone; benzil; 2-ethylanthraquinone; methylbenzoyl formate; 2-hydroxy-2-methyl propiophenone, 2-hydroxy-2-methyl-4'-isopropyl-isopropiophenone; 1-hydroxycyclohexyl phenyl ketone; a mixture thereof; and the like.

The photosensitive resin composition of the present invention may further contain a polymerization inhibitor in an amount of 0.001 to 2.0% by weight based on the total amount of the resin composition. Suitable polymerization inhibitors include hydroquinone, hydroquinone monomethyl ether, mono-t-butyl hydroquinone, catechol, p-t-butyl catechol, 2,6-di-t-butyl-p-cresol, benzoquinone, 2,5-diphenyl-p-benzoquinone, p-methoxyphenol, t-butyl pyrocatechol, pyrogallol, beta-naphthol, phenothiazine, pyridine, nitrobenzene, dinitrobenzene, nitroso dimers as disclosed in U.K. Patent 1,453,681, bis(substituted-amino)sulfides as disclosed in U.S. Pat. No. 4,168,981 and the like. Other inhibitors, such as p-toluquinone, chloranyl and thiazine dye (e.g. thionine blue (CI 52025), methylene blue-B (CI 52015) and toluidine blue (CI 52040), can also be used. Preferred are 2,6-di-t-butyl-4-methylphenol and p-methoxyphenol.

The resin composition of the present invention may further contain an antioxidant and/or an antiozonant which is compatible with the resin, in order to reduce polymerization inhibition due to oxygen and ozone. Typical examples of the antioxidants are alkylphenols, such as 2,6-di-t-butyl-4-methylphenol; alkylbisphenols, such as 2,2-methylenebis(4-methyl-6-t-butylphenol), 1,3,5-trimethyl-2,4,6-tris(3,5-di-t-butyl-4-hydroxybenzyl)benzene, 2,4-hydroxy-3,5-di-t-butylanilino-4,6-bis(n-octylthio)-1,3,5-triazine, polymeric trimethyldihydroquinone, dilaurylthio dipropionate and the like. Typical examples of the antiozonants are microcrystalline wax, parafin wax, dibutylthio urea, 1,1,3,3-tetramethyl-2-thiourea, Antiozonant AFD (available from Naphthone Company), norbornene (e.g. di-5-norbornene-2-methyl adipate, di-5-norbornene-2-methyl maleate, di-5-norbornene-2-methyl terephthalate), Ozone protector (available from Linehold Chemical Company), N-phenyl-2-naphthylamine, unsaturated plant oils (e.g. rapeseed oil, linseed oil and safflower oil), polymers or resins (e.g. ethylene/vinyl acetate copolymer, chlorinated polyethylene, chlorosulfonated polyethylene, chlorinated ethylene/methacrylic acid copolymer, polyurethane, polypentadiene, polybutadiene, furfural derivative resin, ethylene/propylene/diene rubber, diethyleneglycol ester of rosin and alpha-methylstyrene/vinyltoluene copolymer), and the like.

The resin composition may also contain organic or inorganic filler which is transparent in the wavelength used for exposure to light and which does not scatter active irradiated light. Typical examples of the filler are polystyrene, internally crosslinked micro resin particles (microgel), silica, bentonite, silica, glass powder, colloid carbon and the like. The filler generally improves strength of the composition layer and reduces tackiness. A dye or pigment may also be contained in the composition.

The amount of the additives is not limited and can be varied widely.

The resin composition may contain a plasticizer to reduce the glass transition temperature of the binder and make it possible to selectively develop. Examples of the plasticizers are disalkyl phthalate, alkyl phosphate, polyethylene glycol, polyethylene glycol ester and polyethyleneglycol ether and the like.

The photosensitive resin composition of the present invention contains:

(A) 10 to 90% by weight, preferably 25 to 80% by weight, of the crosslinked polymer particles,
(B) 10 to 70% by weight, preferably 15 to 50% by weight, of the hydrophobic elastomer,
(C) 1 to 25% by weight, preferably 2 to 20% by weight, of the hydrophilic polymer,
(D) 1 to 30% by weight, preferably 1 to 15% by weight, of the basic nitrogen-containing compound,
(E) 1 to 60% by weight, preferably 3 to 40% by weight, of the photopolymerizable ethylenically unsaturated monomer, and
(F) 0.01 to 10% by weight, preferably 0.05 to 5% by weight, of the photopolymerization initiator, % by weight being based on the total solid content of the composition. If the amount of polymer particles (A) is less than 10% by weight, water developability is poor. If it is more than 90% by weight, film-forming ability is poor and film strength is also poor. If the amount of elastomer (B) is less than 10% by weight, film strength is poor. If it is more than 70% by weight, water developability and image quality after printing are poor. If the amount of hydrophilic polymer (C) is less than 1% by weight, water developability is poor and if it is more than 25% by weight, water resistance of the printing plate is poor. If the amount of basic nitrogen-containing compound (D) is less than 1% by weight, water developability is poor and if it is more than 30% by weight, water resistance of the printing plate is poor. If the amount of monomer (E) is less than 1% by weight, curing ability is poor and if it is more than 60% by weight, solid retention is poor. If the amount of initiator (F) is less than 0.01, photosensitivity is poor and if it is more than 10% by weight, image quality after printing is poor. The photosensitive composition is generally prepared by art-known methods, for by mixing the above (A) to (F).

The photosensitive resin composition is very suitable for flexographic printing. A resin plate for flexographic printing is obtained by forming a layer of the photosensitive resin composition on a substrate by art-known methods, such as melt-extruding or calender molding. The substrate includes a plastic plate or sheet, a rubber sheet, a foamed olefin sheet, a foamed rubber sheet, a foamed urethane sheet, a metal plate or sheet. If necessary, an adhesive layer may be formed between the photosensitive resin layer and the substrate.

The obtained photosensitive resin plate is exposed to light through a negative film having a suitable image, so that the exposed portion cures to form a latent image. The light to be exposed includes ultraviolet light. After the exposure, the resin plate is developed with water, so that the portion or non-exposed portion is eluted out, thus obtaining a printing plate having a relief which has excellent image reproducibility, water resistance, rubber resilience and mechanical properties. The resin plate has excellent water developability and the obtained printing plate has excellent durability, thus being very suitable for flexographic printing. The resin plate also has ozonization resistance which can be more improved by annealing the plate at an elevated temperature before use.

EXAMPLES

The present invention is illustrated by the following Examples which, however, are not to be construed as limiting the present invention to their details. The term "part" is based on weight, unless otherwise indicated.

EXAMPLE 1

A two liter reaction vessel, equipped with a stirrer, a cooling condenser, a nitrogen-gas inlet tube and a thermometer, was charged with 500 parts of a xylene solution (90% solid content) of LIR 30 (a polyisoprene having a molecular weight of 29,000 available from Kuraray Co., Ltd.), 30 parts of maleic anhydride and one part of N-phenyl-(1,3-dimethylbutyl)-p-phenyldiamine, and reacted at 190° C. for 6 hours under a nitrogen blanket to obtain a melaic polyisoprene. To the content, 30 parts of n-butanol, 3 parts of-N,N-dimethylbenzylamine and 17 parts of xylene were added and reacted at 135° C. for 30 minutes. The resulting mixture contained a half-esterified maleic polyisoprene (C-1) having a solid content of 90%, an acid value of 40 and a molecular weight of 32,000.

Five parts of the modified polyisoprene (C-1) was mixed by a pressurized kneader with 35 parts of crosslinked polymer particles (A-1) (having a particle size of 0.05 micron, obtained from 69.0 wt % of 1,3-butadiene, 9.0 wt % of methacrylic acid, 2.0 wt % of divinyl benzene and 20.0 wt % of methyl methacrylate), 7 parts of N,N-dimethylaminopropylmethacrylamide, 28 parts of styrene-isoprene-styrene copolymer (B-1) (having 90 mol % of diene unit, a molecular weight of 140,000, two glass transition temperatures of −60° C. for rubber portion and 95° C. for polystyrene portion, available from Shell Chemical Ltd. as Kraton #1107), 13 parts of lauryl methacrylate, 10 parts of 1,6-hexanediol dimethacrylate, 0.25 parts of 2-ethylanthraquinone, 0.25 parts of benzoyl methyl ether and 0.5 parts of 2,6-di-t-butyl-p-cresol to form a mixture. The mixture was extruded by a kneader extruder having a T-die onto a polyester film on which a chloroprene adhesive layer (available from Hitachi Chemical Co., Ltd. as HIBON 1920LT) having 5 micron had been formed. The resulting resin plate had a photosensitive resin layer with about 1.7 mm thickness.

The resin plate was contacted with a negative film having a suitable-image under vacuum, and exposed to a 350 W ultraviolet lamp for 10 minutes. It was then developed with water at 40° C., using an elution machine available from Nippon Densiseiki K.K. as JW-A2-PD, to obtain a printing plate having a relief image 0.76 mm coherent with the negative film.

The printing plate, as shown in Table 1, had impact resilience and so tough that no change is shown after flexographic-printing 150,000 sheets of paper at a printing rate of 500 feet/min, with an aqueous flexographic ink.

EXAMPLE 2

A printing plate was prepared as generally described in Example 1, witch the exception that a half-esterified maleic polyisoprene (C-2) having a molecular weight of 25,000 and an acid value of 21 (available from Kuraray Co., Ltd. as LIR-410) was employed instead of the modified polyisoprene (C-1). The printing plate was resilient and tough, so than no change was shown after printing at the same condition as Example 1.

EXAMPLE 3

A two liter reaction vessel, equipped with a stirrer, a cooling condenser, a nitrogen-gas introducing tube and a thermometer, was charged with 500 parts of a xylene solution (90% solid content) of LIR 310 (a styrene-isoprene copolymer having a molecular weight of 30,000 available from Kuraray Co., Ltd.), 30 parts of maleic anhydride and one part of N-phenyl-(1,3-dimethylbutyl)-p-phenyldiamine, and reacted at 190° C. for 6 hours under a nitrogen blanket to obtain a maleic polyisoprene. To the content, 30 parts of n-butanol, 3 parts of N,N-dimethylbenzylamine and 15 parts of xylene were added and reacted at 135° C. for 30 minutes. The resulting mixture contained a half-esterified maleic styrene-isoprene copolymer (C-3) having a solid content of 90%, an acid value of 40 and a molecular weight of 33,000.

A printing plate was prepared as generally described in Example 1, with the exception that a half-esterified styrene-isoprene copolymer (C-3) having a molecular weight of 25,000 and an acid value of 21 (available from Kuraray Co., Ltd. as LIR-410) was employed instead of the modified polyisoprene (C-1). The printing plate was resilient and tough, so than no change was shown after printing at the same condition as Example 1.

EXAMPLE 4

A printing plate was prepared as generally described in Example 1, with the exception that crosslinked polymer particles (A-2), which were obtained by emulsion-polymerizing 70 wt % of a maleic polyisoprene which was half-esterified with 2-hydroxyethyl methacrylate and n-butanol, 10 wt % of an acryloyl modified polybutadiene (available from Idemitsu Petroleum Co., Ltd. as ACR-LC), 20 wt % of methyl methacrylate and 2 wt % of divinyl benzene, were employed instead of the crosslinked polymer particles (A-1). The printing plate was resilient and tough, so than no change was shown after printing at the same condition as Example 1.

COMPARATIVE EXAMPLE 1

A printing plate was prepared as generally described in Example 1, with the exception that 41 parts of the crosslinked polymer particles (A-1) was mixed with 7 parts of N,N-dimethylaminopropyl methacrylamide, 10 parts of a half-esterified maleic polyisoprene (available from Kuraray Co., Ltd. as LIR-410), 13 parts of lauryl methacrylate, 10 parts of 1,6-hexanediol dimethacrylate, 0.5 parts of 2-ethylanthraquinone and 0.5 parts of 2,6-di-t-butyl-p-cresol. The printing plate had poor rubber resilience, poor toughness and provided poor image quality. The results are shown in Table 1.

COMPARATIVE EXAMPLE 2

A printing plate was prepared as generally described in Example 1, with the exception that a half-esterified maleic polyisoprene (C-1) was not employed. The printing plate had poor water developability and provided poor image quality. The results are shown in Table 1.

COMPARATIVE EXAMPLE 3

A printing plate was prepared as generally described in Example 1, with the exception that a styrene-isoprene copolymer (B-2) having a molecular weight of 30,000 and a glass transition temperature of −60° C. (available from Kuraray Co., Ltd. as LIR-310) was employed instead of the half-esterified maleic isoprene polymer. The resulting resin plater had poor water developability and provided poor image quality. The results are shown in Table 1.

EXAMPLE 5

A same reaction vessel as Example 1 was charged with 500 parts of a xylene solution (90% solid content) of LIR 310 (a styrene-isoprene copolymer having a molecular weight of 30,000 available from Kuraray Co., Ltd.), 43 parts of maleic anhydride and one part of N-phenyl-(1,3-dimethylbutyl)-p-phenyldiamine, and reacted at 190° C. for 6 hours under a nitrogen blanket to obtain a maleic polyisoprene. To the content, 43 parts of 2-hydroxyethyl methacrylate, 10 parts of n-butanol, 3 parts of N,N-dimethylbenzylamine and 17 parts of xylene were added and reacted at 135° C. for 30 minutes. The resulting mixture contained a half-esterified maleic polyisoprene (C-4) having a solid content of 90%, an acid value of 46 and a molecular weight of 36,000.

A printing plate was prepared as generally described in Example 1, with the exception that the above obtained half-esterified maleic styrene-isoprene copolymer (C-4) was employed instead of the modified polyisoprene (A-1). The printing plate was resilient and tough, so than no change was shown after printing at the same condition as Example 1.

EXAMPLE 6

A printing plate was prepared as generally described in Example 1, with the exception that a styrene-isoprene copolymer having a molecular weight of 100,000 and a glass transition temperature of −45° C. was employed instead of the polyisoprene. No change was shown after printing at the same condition as Example 1.

EXAMPLE 7

A printing plate was prepared as generally described in Example 1, with the exception that a butadiene-methyl methacrylate (70/30) copolymer (B-4) was employed instead of the polyisoprene. No change was shown after printing at the same condition as Example 1.

EXAMPLE 8

A printing plate was prepared as generally described in Example 1, with the exception that 20 parts of the crosslinked polymer particles (A-1) and 44 parts of the hydrophobic elastomer (B-1) were employed. The results of the evaluation of the printing plate are shown in Table 1.

TABLE 1

|  | Examples | | | | | | | | Comparative Examples | | |
| --- | --- | --- | --- | --- | --- | --- | --- | --- | --- | --- | --- |
|  | 1 | 2 | 3 | 4 | 5 | 6 | 7 | 8 | 1 | 2 | 3 |
| Water developability*[1] (mm/min) | 0.25 | 0.25 | 0.25 | 0.20 | 0.20 | 0.16 | 0.22 | 0.16 | 0.20 | 0.05 | 0.08 |
| Impact resilience 20° C. (%) | 40 | 40 | 42 | 40 | 42 | 38 | 37 | 48 | 30 | 40 | 40 |
| Shore A hardness 20° C. (degree) | 48 | 52 | 49 | 52 | 52 | 55 | 57 | 40 | 55 | 48 | 49 |
| Toughness of film*[2] | 40.3 | 37.4 | 46.8 | 38.1 | 50.8 | 39.6 | 36.6 | 55.5 | 15.0 | 39.1 | 38.1 |
| 85 LPI dot depth (micron) | | | | | | | | | | | |
| 60% | 58 | 52 | 62 | 50 | 58 | 48 | 56 | 50 | 50 | 25 | 30 |
| 90% | 20 | 20 | 21 | 20 | 20 | 16 | 20 | 20 | 18 | 6 | 8 |

*[1]A film thickness which was eluted out for one minute.
*[2]Rupture energy determined by a tensile test according to JIS K-6301.

In the present invention, one of the most important features is that the crosslinked polymer particles are combined with both the hydrophilic polymer and the hydrophobic elastomer. However, in case where the crosslinked polymer particles are combined only with the hydrophilic polymer, water developability and image reproducibility are sufficient, but elasticity is poor and it is difficult to use for flexographic printing. In case where the polymer particles are combined with the hydrophobic elastomer, elasticity and film strength are good, but water developability and image reproducibility are poor. Accordingly, both performances, i.e. elasticity and developability, should be balanced for printing, especially flexographic printing.

The photosensitive resin composition of the present invention has excellent water developability and the exposed portion provides a faithful image to the negative film. The printing plate obtained therefrom has toughness and elasticity.

Image reproducibity is generally governed by the balance of eluting rate between the exposed portion and the non-exposed portion. Especially, the non-exposed portion is required to have quick eluding rate and the exposed portion should have excellent mechanical properties, particularly film strength, and toughness, which provide durability during printing and good image quality.

In the prior art, it is proposed that the crosslinked polymer particles are combined with a diene type linear polymer. Both the polymers have poor compatibility, because of the following reasons:

(1) In the combination of the crosslinked polymer particles and the hydrophobic diene type linear polymer, the surface of the crosslinked polymer particles is strongly hydrophilic and the diene type linear polymer adversely is hydrophobic. Accordingly, both polymers have poor compatibility because of a large difference of solubility parameters, thus forming an incompatible or noncompatible mixture. Especially, upon water-developing, the crosslinked polymer particles are covered with the hydrophilic diene polymers and therefore exhibit poor water developability.

(2) In the combination of the crosslinked polymer particles and the hydrophilic diene linear polymer, the solubility parameters of both polymers are similar and the mixture obtained therefrom is substantially a compatible blend. Accordingly, the composition shows good water developabity, but exhibits poor mechanical properties because the hydrophilic polymers form a pool network between the polymer particles.

In the present invention, the hydrophobic elastomers form a network of the polymer particles as coiling with each other and the network is also surrounded with the hydrophilic polymers, thus stabilizing the hydrophobic polymers. Accordingly, the polymer particles have good compatibility and improved mechanical properties, even if the hydrophobic polymer has a high molecular weight or is used in a large amount.

What is claimed is:

1. A photosensitive resin composition comprising:
   (A) 25 to 80% by weight of crosslinked polymer particles having a particle size of 0.01 to 5 micron, prepared from an aliphatic conjugated diene monomer, a monofunctional monomer and a polyfunctional monomer,
   (B) 10 to 70% by weight of a hydrophobic elastomer having a molecular weight of 5,000 to 1,000,000 and at least one glass transition temperature of 5° C. or less, prepared from at least 30 mol % of a conjugated diene monomer and the balance of other monomers,
   (C) 1 to 25% by weight of a hydrophilic polymer having a molecular weight of 1,000 to 1,000,000, prepared by introducing hydrophilic groups into a backbone polymer selected from the group consisting of (1) a polymer obtained from a conjugated diene, (2) a copolymer of a conjugated diene and a monoolefinic unsaturated compound, and (3) a vinyl polymer other than the polymer (1) and the copolymer (2),
   (D) 1 to 30% by weight of a basic nitrogen-containing compound,
   (E) 1 to 60% by weight of a photopolymerizable ethylenically unsaturated monomer, and
   (F) 0.01 to 10% by weight of a photopolymerization initiator; % by weight being based on a total amount of the resin composition.

2. The photosensitive resin composition according to claim 1 wherein said crosslinked polymer particles (A) are prepared from
   (1) 20 to 95% by weight of an aliphatic conjugated diene monomer,
   (2) 0.1 to 30% by weight of alpha, beta-ethylenically unsaturated carboxyl group-containing monomer, (3) 0.1 to 10% by weight of a monomer having at least 2 addition-polymerizable groups in one molecule, and (4) 0.5 to 70% by weight of copolymerizable monomer other than the monomers (1), (2) and (3).

3. The photosensitive resin composition according to claim 1 wherein said basic nitrogen-containing compound (D) is represented by the following formula (I) or (II):

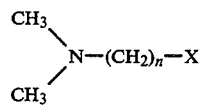

wherein n is an integer of 1 to 3, X represents —O—CO—CR=CH$_2$, —NH—CO—CR=CH$_2$ or —O—CO—NH—CO—CR=CH$_2$ in which R independently represents a hydrogen atom or a methyl group

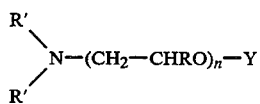

wherein n is an integer of 1 to 6 when R' is a methyl group and an integer of 2 to 6 when R' is an ethyl group, Y represents a hydrogen atom, —CO—CR=CH$_2$ or —CO—NH—CO—CR=CH$_2$ in which R independently represents a hydrogen atom or a methyl group.

4. A photosensitive resin plate for flexoprinting comprising a substrate and a layer of a photosensitive resin composition formed thereon, wherein said photosensitive resin composition comprises (A) 25 to 80% by weight of crosslinked polymer particles having a particle size of 0.01 to 5 micron, prepared from an aliphatic conjugated diene monomer, a monofunctional monomer and a polyfunctional monomer, (B) 10 to 70% by weight of a hydrophobic elastomer having a molecular weight of 5,000 to 1,000,000 and at least one glass transition temperature of 5° C. or less, prepared from at least 30 mol % of a conjugated diene monomer and the balance of other monomers, (C) 1 to 25% by weight of a hydrophilic polymer having a molecular weight of 1,000 to 1,000,000, prepared by introducing hydrophilic groups into a backbone polymer selected from the group consisting of (1) a polymer obtained from a conjugated diene, (2) a copolymer of a conjugated diene and a monoolefinic unsaturated compound, and (3) a vinyl polymer other than the polymer (1) and the copolymer (2), (D) 1 to 30% by weight of a basic nitrogen-containing compound, (E) 1 to 60% by weight of a photopolymerizable ethylenically unsaturated monomer, and (F) 0.01 to 10% by weight of a photopolymerization initiator; % by weight being based on a total amount of the resin composition.

5. The photosensitive resin plate for flexoprinting according to claim 4 wherein said crosslinked polymer particles (A) are prepared from (1) 20 to 95% by weight of an aliphatic conjugated diene monomer, (2) 0.1 to 30% by weight of alpha, beta-ethylenically unsaturated carboxyl group-containing monomer, (3) 0.1 to 10% by weight of a monomer having at least 2 addition-polymerizable groups in one molecule, and (4) 0.5 to 70% by weight of copolymerizable monomer other than the monomers (1), (2) and (3).

6. The photosensitive resin plate for flexoprinting according to claim 4 wherein said basic nitrogen-containing compound (D) is represented by the following formula (I) or (II):

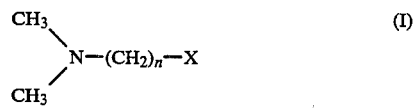

wherein n is an integer of 1 to 3, X represents —O—CO—CR=CH$_2$, —NH—CO—CR=CH$_2$ or —O—CO—NH—CO—CR=CH$_2$ in which R independently represents a hydrogen atom or a methyl group

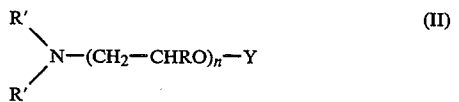

wherein n is an integer of 1 to 6 when R' is a methyl group and an integer of 2 to 6 when R' is an ethyl group, Y represents a hydrogen atom, —CO—CR=CH$_2$ or —CO—NH—CO—CR=CH$_2$ in which R independently represents a hydrogen atom or a methyl group.

7. The photosensitive resin plate for flexoprinting according to claim 4 wherein said photosensitive resin composition layer is formed by melt-mixing said components (A) to (F) and then extruding the resultant mixture on said substrate.

* * * * *